United States Patent
Liu et al.

(10) Patent No.: US 10,276,366 B2
(45) Date of Patent: Apr. 30, 2019

(54) LOW INTERFACE STATE DEVICE AND METHOD FOR MANUFACTURING THE SAME

(71) Applicant: Institute of Microelectronics, Chinese Academy of Sciences, Beijing (CN)

(72) Inventors: Xinyu Liu, Beijing (CN); Sen Huang, Beijing (CN); Xinhua Wang, Beijing (CN); Ke Wei, Beijing (CN); Wenwu Wang, Beijing (CN); Junfeng Li, Beijing (CN); Chao Zhao, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 237 days.

(21) Appl. No.: 14/821,203

(22) Filed: Aug. 7, 2015

(65) Prior Publication Data
US 2016/0268124 A1     Sep. 15, 2016

(30) Foreign Application Priority Data

Mar. 10, 2015 (CN) .......................... 2015 1 0103253

(51) Int. Cl.
   *H01L 21/02* (2006.01)
   *C23C 16/02* (2006.01)
   *C23C 16/30* (2006.01)

(52) U.S. Cl.
CPC .... *H01L 21/02271* (2013.01); *C23C 16/0245* (2013.01); *C23C 16/303* (2013.01); *H01L 21/0254* (2013.01); *H01L 21/02164* (2013.01); *H01L 21/02315* (2013.01); *H01L 21/02664* (2013.01)

(58) Field of Classification Search
CPC combination set(s) only.
See application file for complete search history.

(56) References Cited

U.S. PATENT DOCUMENTS

| 2013/0306978 A1 | 11/2013 | Chen et al. |
| 2015/0318308 A1* | 11/2015 | Matsumoto ......... H01L 27/1222 345/501 |

FOREIGN PATENT DOCUMENTS

CN    1767173 A    5/2006

OTHER PUBLICATIONS

Qin, APL, V103, N22, 2013.*
Shu Yang, IEEE, ED Letters, V 34, N12, 2013.*

(Continued)

*Primary Examiner* — Hrayr A Sayadian
(74) *Attorney, Agent, or Firm* — BainwoodHuang

(57) ABSTRACT

A method for manufacturing a low interface state device includes performing a remote plasma surface process on a III-Nitride layer on a substrate; transferring the processed substrate to a deposition cavity via an oxygen-free transferring system; and depositing on the processed substrate in the deposition cavity. The deposition may be low pressure chemical vapor deposition (LPCVD). The interface state between a surface dielectric and III-Nitride material may be significantly decreased by integrating a low impairment remote plasma surface process and LPCVD.

9 Claims, 5 Drawing Sheets

(56) References Cited

OTHER PUBLICATIONS

Xiaoye Qin, et al., "In Situ x-ray photoelectron spectroscopy and capacitance voltage characterization of plasma treatments for Al2O3/AlGaN/GaN stacks", Department of Materials Science and Engineering, University of Texas at Dallas, Appl. Phys. Lett. 105, 011602 (2014); doi: 10.1063/1.4887056, American Institute of Physics, Jul. 7, 2014.

Cheng Liu, et al., "AlN/GaN heterostructure TFTs with plasma enhanced atomic layer deposition of epitaxial AlN thin film", Phys. Status Solidi C 11, No. 3-4, 953-956 (2014)/DOI 10.1002/pssc.201300442, Mar. 10, 2014.

Office Action dated Dec. 7, 2016 from SIPO of China in counterpart Chinese Patent Application No. 201510103253.6, English translation of Office Action dated Dec. 7, 2016.

Casey et al. "Low interface trap density for remote plasma deposited SiO2 on n-type GaN", Applied Physics Letters, vol. 68, No. 13, Mar. 25, 1996, American Institute of Physics, pp. 1850-1852.

Chen et al. "AlN passivation by plasma-enhanced atomic layer deposition for GaN-based power switches and power amplifiers", Semi-Conductor Science and Technology, vol. 28, (2013), IOP Publishing, 8 pages.

Hod et al. "Characterization of interface states in Al2O3AlGaNGaN structures for improved performance of high-electron-mobility transistors", Journal of Applied Physics 114, 244503 (2013), AIP Publishing, LLC, 4 pages.

Huang et al., "Effective Passivation of AlGaNGaN HEMTs by ALD-Grown AlN Thin Film", IEEE Electron Device Letters, vol. 33, No. 4, Apr. 2012, IEEE, pp. 516-518.

Huang et al. "Mechanism of PEALD-Grown AlN Passivation for AlGaNGaN HEMTs Compensation of Interface Traps by Polarization Charges" IEEE Electron Device Letters, vol. 34, No. 2, Feb. 2013, IEEE, pp. 193-195.

Huang et al. "High-fMAX High Johnson's Figure-of-Merit 0.2-μm Gate AlGaNGaN HEMTs on Silicon Substrate With AlN/SiNx Passivation" IEEE Electron Device Letters, vol. 35, No. 3, Mar. 2014, IEEE, pp. 315-317.

Liu et al. "Plasma-Enhanced Atomic Layer Deposition of AlN Epitaxial Thin Film for AlNGaN Heterostructure TFTs", IEEE Electron Device Letters, vol. 34, No. 9, Sep. 2013, IEEE, pp. 1106-1108.

Liu et al. "Al2O3/AlN/GaN MOS-Channel-HEMTs With an AlN Interfacial Layer", IEEE Electron Device Letters, vol. 35, No. 7, Jul. 2014 IEEE, pp. 723-725.

Qin et al, "A crystalline oxide passivation for Al2O3/AlGaN/GaN", Applied Physics Letters 105, 141604 (2014), AIP Publishing LLC, 5 pages.

Yang et al. "High-Quality Interface in Al2O3GaNAlGaNGaN MIS Structures With In Situ Pre-Gate Plasma Nitridation". IEEE Electron Device Letters, vol. 34, No. 12, Dec. 2013, IEEE, pp. 1497-1499.

Yang et al. "Mapping of Interface Traps in High-Performance Alinf2infOinf3infAlGaNGaN MIS-Heterostructures Using Frequency- and Temperature Dependent C-V Techniques", IEEE, 2013, pp. 6.3.1-6.3.4.

\* cited by examiner

LOW INTERFACE STATE DEVICE AND METHOD FOR MANUFACTURING THE SAME

CROSS-REFERENCE TO RELATED APPLICATION(S)

This application claims priority to Chinese Application No. 201510103253.6, filed on Mar. 10, 2015, entitled "LOW INTERFACE STATE DEVICE AND METHOD FOR MANUFACTURING THE SAME", which is incorporated herein by reference in their entirety.

TECHNICAL FIELD

The present disclosure relates to the field of semiconductor technology, and particularly to a low interface state device and a method for manufacturing the same.

BACKGROUND

Application of III-Nitride electronic devices is considerably restricted due to a high interface state between III-Nitride material and its passivation layer or gate dielectric. According to research results, it is the interface oxidation in the technical process of III Nitride that leads to the high interface state. Additionally, Low Pressure Chemical Vapor Deposition (LPCVD) technology is a much mature technique for manufacturing film dielectric in CMOS processes. Currently, how to lower down the interface state and thus form high-quality film layers using deposition techniques, such as LPCVD, has become essential in promoting the industrialization of III-Nitride power electronics.

SUMMARY

The object of the present disclosure is at least to provide a method that can be used to manufacture III-Nitride devices with a low interface state.

According to one aspect of the present disclosure, a method for manufacturing a low interface state device is proposed, comprising: performing a remote plasma surface process on III-Nitride layer on a substrate; transferring the processed substrate to a deposition cavity via an oxygen-free transferring system; and depositing on the processed substrate in the deposition cavity.

According to another aspect of the present disclosure, a low interface state device is proposed, comprising: III-Nitride layer epitaxially grown on a substrate; and nitride dielectric layer deposited on the III-Nitride layer that is subjected to a remote plasma surface process via low pressure chemical vapor deposition LPCVD.

The remote plasma surface process may remove surface oxidation layer of the III-Nitride layer and repair impairment, and thus reduce the interface state between the III-Nitride layer and the subsequently deposited layer. For example, the plasma used in the plasma surface process belongs to soft plasma which is of low energy. The substrate may be heated, and the III-Nitride layer is then subjected to the plasma surface process using the soft plasma. The temperature range for the plasma surface process is between room temperature and 750° C.

Additionally, the surface of the III-Nitride may be protected from re-oxidation by using oxygen-free atmosphere between the surface process and deposition process. For example, the oxygen-free transferring system may be in vacuum state or in nitrogen atmosphere. In one example, the oxygen-free transferring system may comprise an oxygen-free transferring path that is connected between a cavity in which the remote plasma surface process is performed and the deposition cavity, wherein the processed substrate is transferred via the oxygen-free transferring path.

For example, the deposition may be low pressure chemical vapor deposition LPCVD. A nitride dielectric layer may be deposited on the substrate with the LPCVD. High-quality layers may be grown at high temperature with LPCVD. Accordingly, the interface state between the deposited layer and the III-Nitride layer may be further effectively decreased.

According to embodiments of the present disclosure, a III-Nitride layer with surface activities may be provided by integrating a low impairment remote plasma surface process and deposition techniques.

According to other embodiments, the interface state between a surface dielectric and III-Nitride material is significantly decreased by integrating a low impairment remote plasma surface process and LPCVD.

BRIEF DESCRIPTION OF THE DRAWINGS

The present disclosure is described in detail herein with reference to drawings and embodiments, wherein.

It should be noted that, the drawings are only exemplary but not to scale. Therefore, they should not be construed as any limitation or constraint to the scope of the present disclosure. In the drawings, like components are identified by like numeral signs.

THE DESCRIPTION OF EMBODIMENTS

Figure 1:
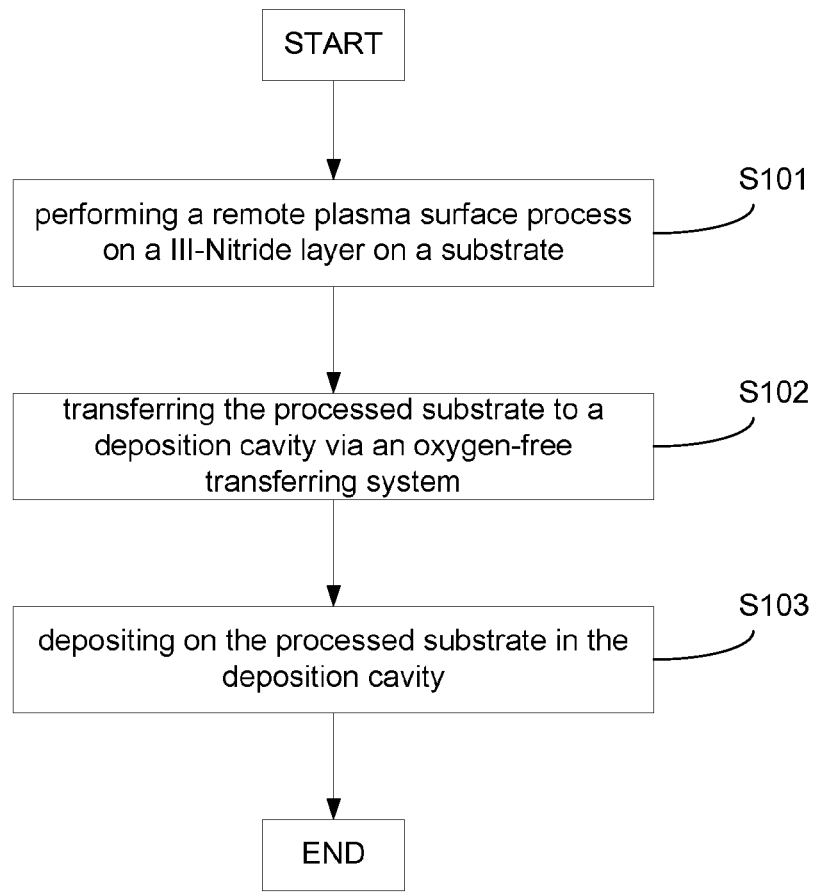
FIG. 1 shows a method for manufacturing a low interface state device according to an embodiment of the present disclosure.

The embodiments of the present disclosure will be described with reference to the drawings as below. It should be appreciated that, such description is only exemplary, and not to limit the scope of the present disclosure. Additionally, description regarding common structures and technologies is omitted in the following description to avoid unnecessary ambiguousness.

Diagrams of layer structures according to embodiments of the present disclosure are shown in the drawings. These drawings are not drawn in proportion. Some details are enlarged for clearness, and some details may be omitted. Shapes of regions and layers as shown in the drawings and size and position relationship between them are only exemplary, and practical deviations may exist due to manufacturing and technique limitations. Additionally, those skilled in the art may design regions/layers with different shapes, sizes, relative positions based on actual demands.

According to embodiments of the present disclosure, a III-Nitride layer with surface activities may be provided by combining a low impairment remote plasma surface process and deposition techniques. In particular, the interface state between the surface dielectric and the III-Nitride material may be significantly decreased by integrating a low impairment remote plasma surface process and deposition techniques (especially for low pressure chemical vapor deposition, LPCVD). The low impairment remote plasma surface process may remove the surface oxidation layer of the III-Nitride material and repair impairment, and remedy the disadvantage of the LPCVD system where plasma cannot be generated. The LPCVD system may deposit high-quality dielectric films at high temperature. Additionally, the surface of the III-Nitride may be protected from re-oxidation by using oxygen-free atmosphere between the surface process and deposition process.

Some examples of the present disclosure will be described with reference to the drawings as below.

FIG. 1 shows a method for manufacturing a low interface state device according to an embodiment of the present disclosure. As shown in FIG. 1, the method for manufacturing a low interface state device comprises: performing a remote plasma surface process on III-Nitride layer on a substrate (S101); transferring the processed substrate to a deposition cavity via an oxygen-free transferring system (S102); and depositing on the processed substrate in the deposition cavity (S103). For example, the deposition may comprise low pressure chemical vapor deposition (LPCVD). The low impairment remote plasma surface process may remove the oxidation layer on the surface of the III-Nitride material which was epitaxially grown and repair impairment, so as to achieve a III-Nitride surface with surface activities. As such, the III-Nitride layer with surface activities may be provided by integrating a low impairment remote plasma surface process and deposition techniques. Such a nitride surface with surface activities is applicable for subsequent processes.

Figure 2:
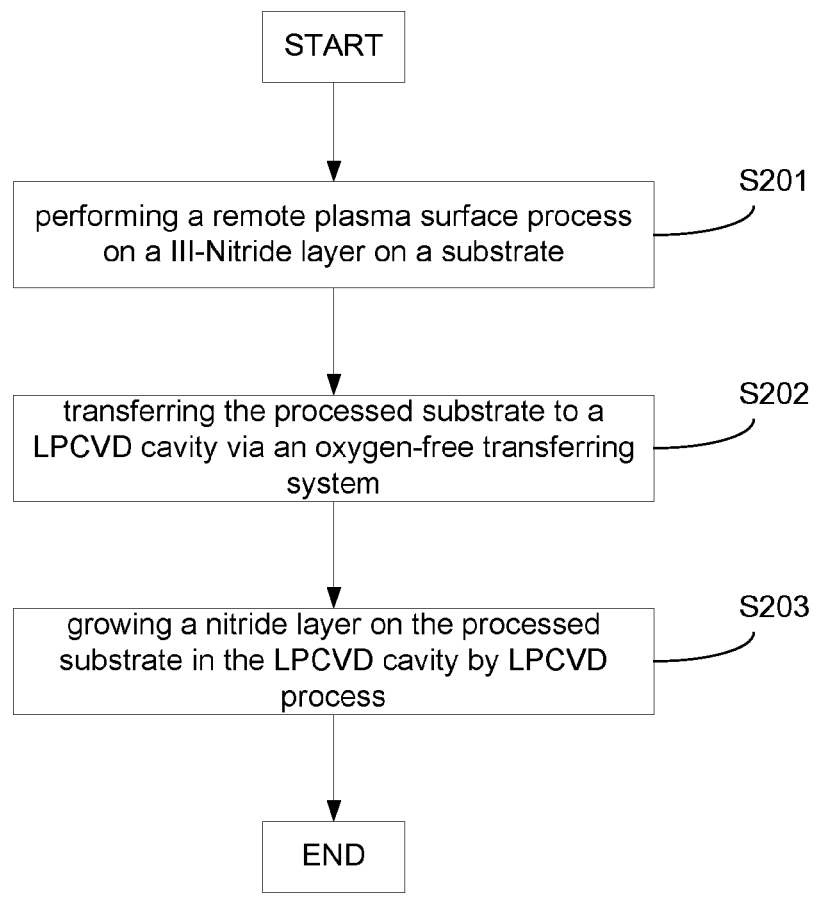
FIG. 2 shows a process that combines the low impairment remote plasma surface process and the LPCVD according to an embodiment of the present disclosure.

FIG. 2 shows a process that combines the low impairment remote plasma surface process and the LPCVD according to an embodiment of the present disclosure. For example, when the deposition is LPCVD, a nitride dielectric layer may be deposited on the substrate via LPCVD. As shown in FIG. 2, the method for manufacturing a low interface state device comprises: performing a remote plasma surface process on a III-Nitride layer on a substrate (S201); transferring the processed substrate to a LPCVD cavity via an oxygen-free transferring system (S202); and growing a nitride layer on the processed substrate in the LPCVD cavity via the LPCVD process (S203). The interface state between the nitride layer grown by LPCVD and the III-Nitride layer may be decreased by performing a surface plasma process on the epitaxially grown nitride. The LPCVD process is high temperature process.

Other substances may be further deposited on the processed substrate. For example, SiO2 may be further deposited on the substrate by LPCVD. Other growing processes, such as LBE, MBE, MOCVD, PECVD and the like, may be performed on a surface that has been pre-processed by the surface plasma process.

Figure 3:
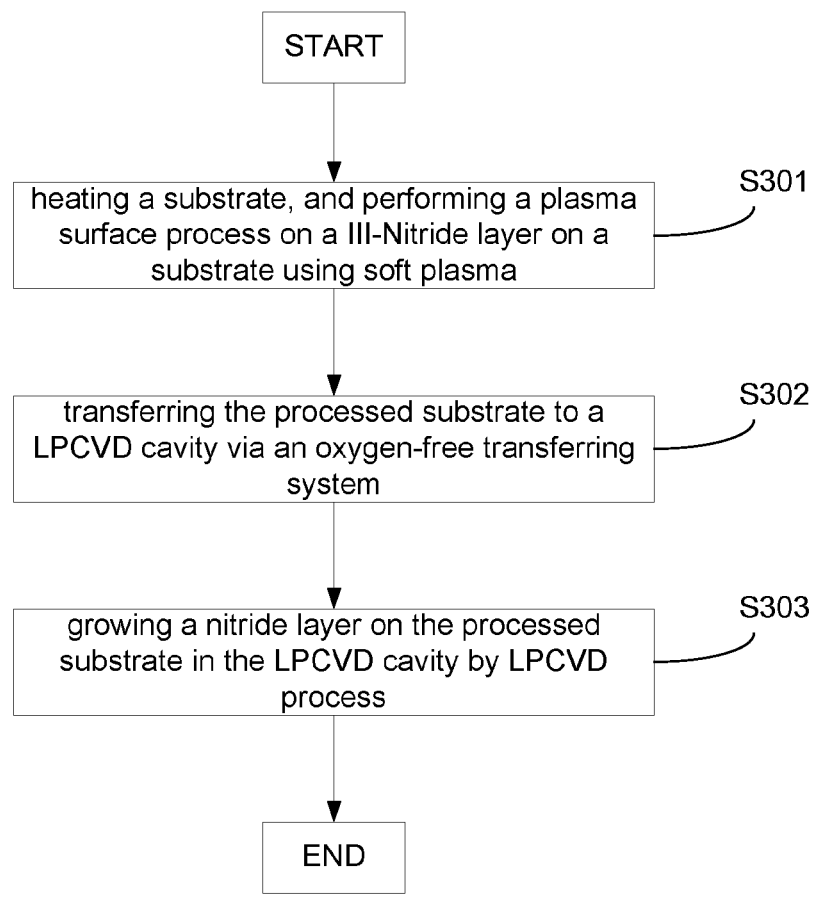
FIG. 3 shows another process that combines the low impairment remote plasma surface process and the LPCVD according to another embodiment of the present disclosure.

FIG. 3 shows another process that combines the low impairment remote plasma surface process and the LPCVD according to another embodiment of the present disclosure. As shown in FIG. 3, the method for manufacturing a low interface state device comprises: heating a substrate, and performing a plasma surface process on a III-Nitride layer on a substrate by using soft plasma (S301); transferring the processed substrate to a LPCVD cavity via an oxygen-free transferring system (S302); and growing a nitride layer on the processed substrate in the LPCVD cavity by the LPCVD process (S303). When performing the remote plasma surface process on the III-Nitride layer, the substrate is first heated, and then subjected to a surface process by using the soft plasma. The reaction surface may be repaired By performing the plasma surface process on the heated substrate.

The so called soft plasma is soft plasma with lower energy (for example, below 200 eV). For example, the plasma may be generated on a position at which the plasma surface process is not performed, and further directed to the surface to-be-processed via a manipulation path. Such plasma that is not generated in-situ has a lower energy, and is thus called "soft" plasma as compared to high energy plasma that is generated in-situ. Soft plasma introduces less impairment to the surface, therefore, the low impairment remote plasma surface process according to the present embodiment may be achieved. For example, the low impairment plasma may be $NH_3$—Ar—$N_2$ plasma.

In particular, the temperature range for the plasma surface process is between room temperature and 750.

Figure 4:
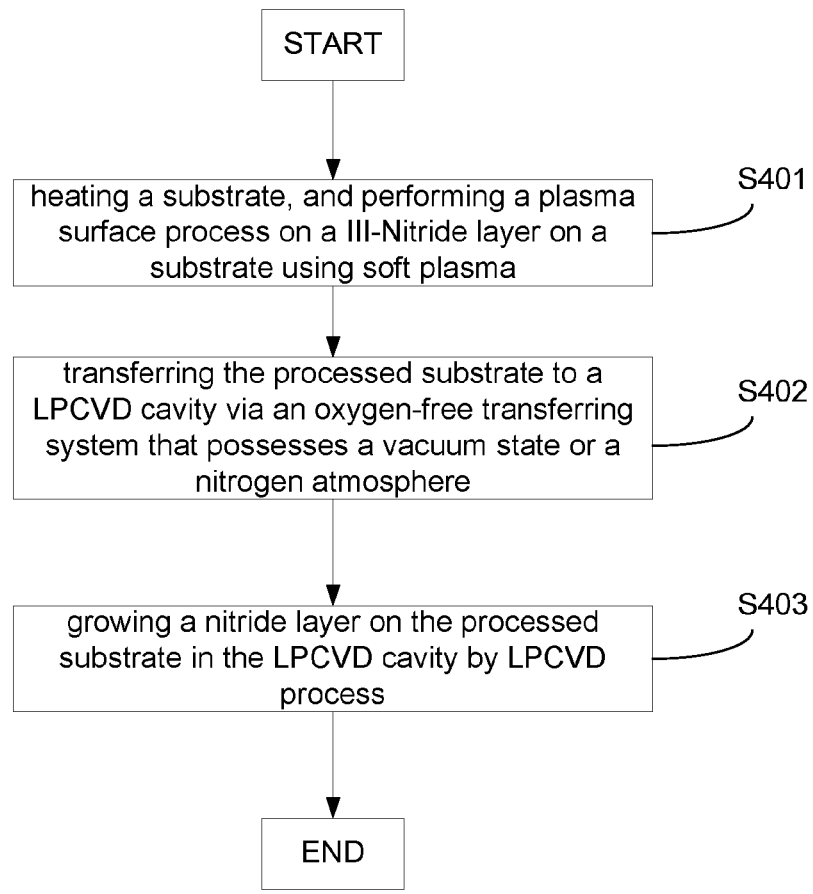
FIG. 4 shows a method for manufacturing a low interface state device according to another embodiment of the present disclosure.

FIG. 4 shows a method for manufacturing a low interface state device according to another embodiment of the present disclosure. As shown in FIG. 4, the method for manufacturing a low interface state device comprises: heating a substrate, and performing a plasma surface process on a III-Nitride layer on a substrate by using soft plasma (S401); transferring the processed substrate to a LPCVD cavity via an oxygen-free transferring system such as a vacuum state or a nitrogen atmosphere (S402); and growing a nitride layer on the processed substrate in the LPCVD cavity by the LPCVD process (S403). The oxygen-free transferring system may comprise an oxygen-free transferring path that is connected between a cavity in which the remote plasma surface process is performed and the deposition cavity, wherein the processed substrate is transferred via the oxygen-free transferring path.

Figure 5:
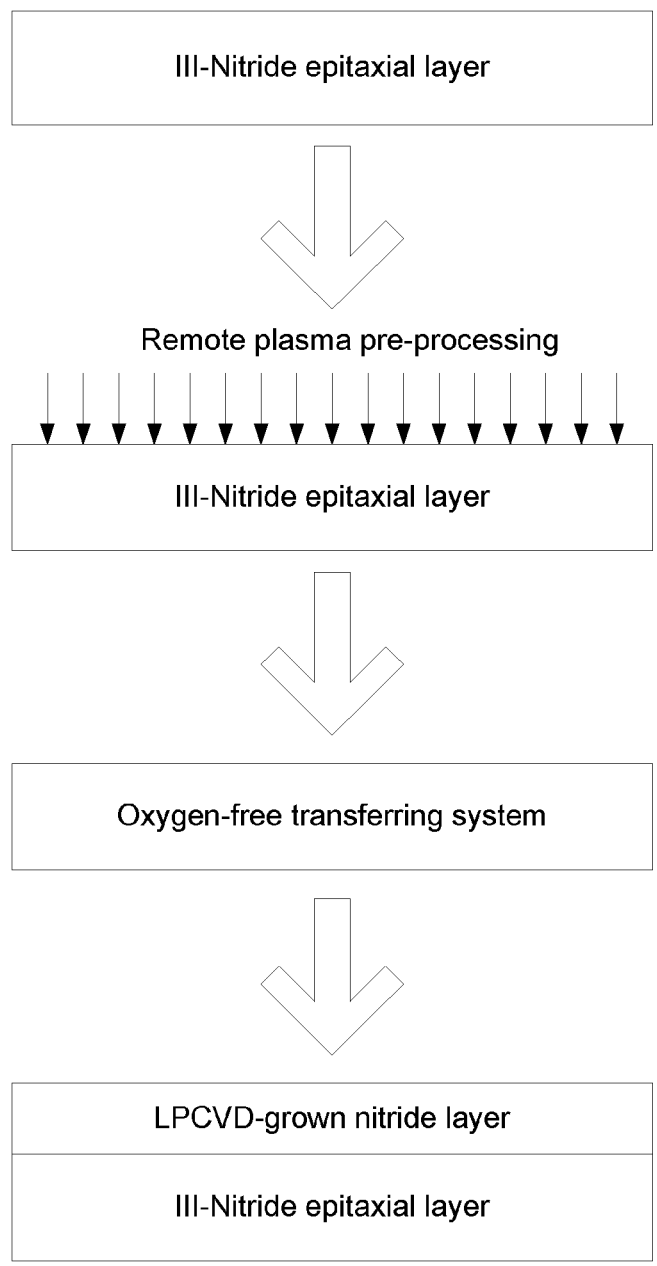
FIG. 5 shows a diagram of the structure obtained at respective stages of the manufacturing process for the low interface device according to an embodiment of the present disclosure.

FIG. 5 shows a diagram of the structure obtained according to part of the manufacturing process for the low interface device according to an embodiment of the present disclosure. The low interface state device comprises: a III-Nitride layer epitaxially grown on a substrate; and a nitride dielectric layer deposited on the III-Nitride layer that is subjected to a remote plasma surface process by low pressure chemical vapor deposition LPCVD. Specifically, as shown in FIG. 5, first, a III-Nitride layer is epitaxially grown on the substrate, and a remote plasma surface process is performed on the surface of the III-Nitride layer on the substrate. Then, the processed substrate is transferred to a LPCVD cavity via an oxygen-free transferring system. Next, a nitride layer is grown on the processed substrate in the LPCVD cavity by the LPCVD process. The interface state between the nitride layer grown by LPCVD and the epitaxially grown III-Nitride layer may be lowered by performing a surface plasma process on the epitaxially grown nitride.

In the disclosure, the interface state between the surface dielectric and the III-Nitride material is significantly decreased by integrating a low impairment remote plasma surface process, oxygen-free environment sample transferring and the high-temperature and low-pressure LPCVD deposition technique. The manufacturing of III-Nitride electronic devices with low interface states remedies a disadvantage in LPCVD growing where the plasma surface pre-process cannot be applied. The LPCVD grows high-quality nitride dielectric at high temperature, effectively decreases the interface state between the dielectric and the III-Nitride, and improves reliability of III-Nitride electronic devices.

Additionally, the present disclosure may protect the surface of the III-Nitride from re-oxidation by using oxygen-free atmosphere between the surface process and deposition process. The present disclosure effectively removes the oxidation layer on the surface of the III-Nitride by using low impairment remote plasma (such as, $NH_3$—Ar—$N_2$) and repairs the impairment (such as nitrogen vacancy on surface).

The integration technique in the present disclosure is beneficial for industrial manufacturing of III-Nitride electronic devices on CMOS processing line.

In the above description, details regarding composition of layers, etching and the like are not particularly illustrated. However, those skilled in the art should appreciate that, layers, regions of required shapes are formed with various approaches in the prior art. Additionally, those skilled in the art may also design other methods to form the same structure.

Although the present disclosure is described as above with reference to the embodiments, such embodiments are only exemplary rather than limitative. The scope of the disclosure is defined by the appended claims and their equivalents. Those skilled in the art may carry out various replacements and modifications without departing the scope of the present disclosure. Such replacements and modifications are within the scope of the present disclosure.

What is claimed is:

1. A method for manufacturing a low interface state device to have a III-nitride layer and a second layer with low interface state therebetween, comprising:
    generating a plasma in a position at which a plasma surface process is not performed;
    directing the generated plasma to a surface to be processed via a manipulation path, producing a soft plasma not generated in-situ and having an energy below 200 eV, the surface being a surface of the III-nitride layer on a substrate of the low interface state device;
    performing a plasma surface process on the III-Nitride layer on the substrate using the soft plasma;
    transferring the processed substrate to a deposition cavity via an oxygen-free transferring system; and
    depositing the second layer on the processed III-nitride surface on the substrate in the deposition cavity.

2. A method according to claim 1, wherein the deposition is low pressure chemical vapor deposition LPCVD.

3. A method according to claim 2, wherein the second layer is a nitride dielectric layer deposited on the substrate by the LPCVD.

4. A method according to claim 2, wherein the second layer is a $SiO_2$ layer deposited on the substrate by the LPCVD.

5. A method according to claim 1, wherein the substrate is heated, and then the III-Nitride layer is subjected to the plasma surface process by using the soft plasma.

6. A method according to claim 1, wherein the temperature range for the plasma surface process is between room temperature and 750° C.

7. A method according to claim 1, wherein the oxygen-free transferring system is in a vacuum state or in a nitrogen atmosphere.

8. A method according to claim 7, wherein the oxygen-free transferring system comprises an oxygen-free transferring path that is connected between a cavity in which the remote plasma surface process is performed and the deposition cavity, wherein the processed substrate is transferred via the oxygen-free transferring path.

9. A method according to claim 1, wherein the soft plasma is a $NH_3$—Ar—$N_2$ plasma.

* * * * *